United States Patent
Duggal et al.

(10) Patent No.: US 6,538,371 B1
(45) Date of Patent: Mar. 25, 2003

(54) WHITE LIGHT ILLUMINATION SYSTEM WITH IMPROVED COLOR OUTPUT

(75) Inventors: Anil Raj Duggal, Niskayuna, NY (US); Alok Mani Srivastava, Niskayuna, NY (US); Holly Ann Comanzo, Niskayuna, NY (US)

(73) Assignee: The General Electric Company, Schenectady, NY (US)

(*) Notice: Subject to any disclaimer, the term of this patent is extended or adjusted under 35 U.S.C. 154(b) by 0 days.

(21) Appl. No.: 09/534,575

(22) Filed: Mar. 27, 2000

(51) Int. Cl.[7] .................................................. H01J 1/63
(52) U.S. Cl. .................. 313/486; 313/503; 252/301.4 H
(58) Field of Search ................. 252/301.4 H, 301.4 R; 313/486, 467, 502; 445/24; 438/116, 127

(56) References Cited

U.S. PATENT DOCUMENTS

| | | | |
|---|---|---|---|
| 3,699,478 A | * 10/1972 | Pinnow et al. | 332/7.51 |
| 4,661,419 A | 4/1987 | Nakamura | 428/691 |
| 5,198,679 A | 3/1993 | Katoh et al. | 250/484.1 |
| 5,336,546 A | * 8/1994 | Hironaka et al. | 428/209 |
| 5,571,451 A | 11/1996 | Srivastava et al. | 252/301.4 |
| 5,813,753 A | 9/1998 | Vriens et al. | 362/293 |
| 5,847,507 A | 12/1998 | Butterworth et al. | 313/512 |
| 5,851,063 A | 12/1998 | Doughty et al. | 362/231 |
| 5,925,897 A | 7/1999 | Oberman | 257/80 |
| 5,966,393 A | 10/1999 | Hide et al. | 372/23 |
| 5,998,925 A | 12/1999 | Shimizu et al. | 313/503 |
| 6,066,861 A | 5/2000 | Höhn et al. | 257/99 |
| 6,069,440 A | 5/2000 | Shimizu et al. | 313/486 |
| 6,203,726 B1 | * 3/2001 | Danielson et al. | 252/301.4 R |
| 6,319,425 B1 | * 11/2001 | Tasaki et al. | 252/301.36 |
| 6,409,938 B1 | * 6/2002 | Comanzo | 252/301.4 R |

OTHER PUBLICATIONS

Keith Butler: Fluorescent Lamp Phosphors, pp. 98–107 (The Pennsylvania State University Press 1980).
S. Nakamura et al.: The Blue Laser Diode, pp. 216–221, 328–329 (Springer 1997).
G. Blasse et al.: Luminescent Materials, pp. 109–110 (Springer–Verlag 1994).

* cited by examiner

Primary Examiner—Nimeshkumar D. Patel
Assistant Examiner—Thelma Sheree Clove
(74) Attorney, Agent, or Firm—Foley & Lardner (57) ABSTRACT

There is provided a white light illumination system including a blue LED and a luminescent material. The system color output is improved when a line connecting the LED color coordinates and the luminescent material color coordinates approximates the Black Body Locus on the CIE chromatically diagram. The LED may have a peak emission wavelength between 470 and 500 nm. The luminescent material may be $(Y_{1-x-z}Gd_xCe_z)_3Al_5O_{12}$, where $0.7 > x > 0.4$ and $0.1 > z > 0$.

61 Claims, 6 Drawing Sheets

WHITE LIGHT ILLUMINATION SYSTEM WITH IMPROVED COLOR OUTPUT

BACKGROUND OF THE INVENTION

This invention relates generally to a white light illumination system, and specifically to a ceramic YAG:Ce:Gd phosphor for converting blue light emitted by a light emitting diode ("LED") to white light.

White light emitting LEDs are used as a backlight in liquid crystal displays and as a replacement for small conventional lamps and fluorescent lamps. As discussed in chapter 10.4 of "The Blue Laser Diode" by S. Nakamura et al., pages 216–221 (Springer 1997), incorporated herein by reference, white light LEDs are fabricated by forming a ceramic phosphor layer on the output surface of a blue emitting semiconductor LED. Conventionally, the blue LED is an InGaN single quantum well LED and the phosphor is a cerium doped yttrium aluminum garnet ("YAG"), $Y_3Al_5O_{12}:Ce^{3+}$. The blue light emitted by the LED excites the phosphor, causing it to emit yellow light. The blue light emitted by the LED is transmitted through the phosphor and is mixed with the yellow light emitted by the phosphor. The viewer perceives the mixture of blue and yellow light as white light.

Figure 1:
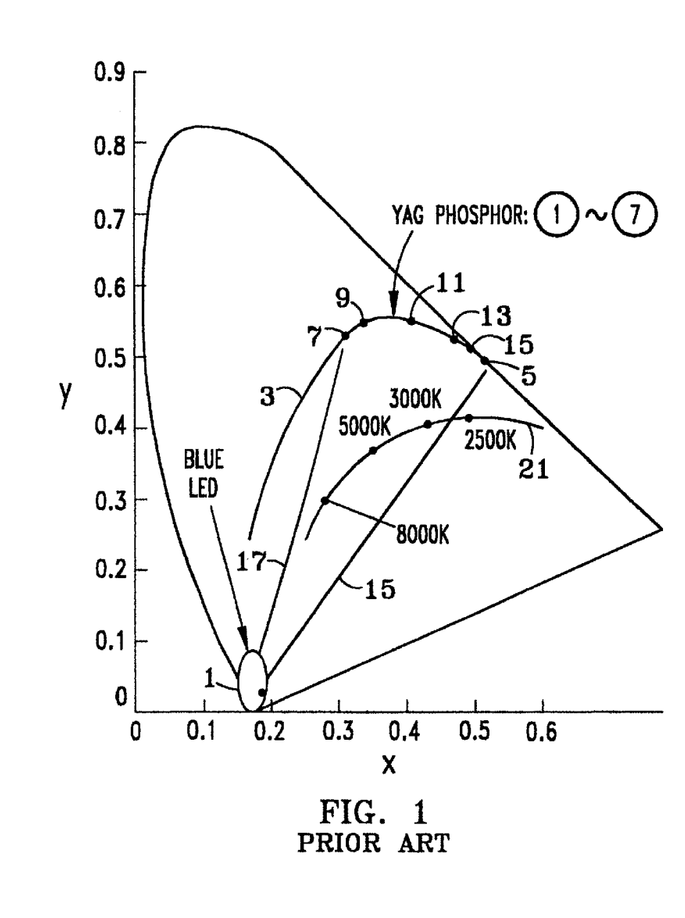
FIGS. 1–2 are CIE chromaticity diagrams of prior art illumination systems.

The chromaticity coordinates of the blue LED, the yellow YAG phosphor and the white combined output of the LED and the phosphor may be plotted on the well known CIE chromaticity diagram, as shown in FIG. 1. The chromaticity coordinates and the CIE chromaticity diagram are explained in detail in several text books, such as pages 98–107 of K. H. Butler, "Fluorescent Lamp Phosphors" (The Pennsylvania State University Press 1980) and pages 109–110 of G. Blasse et al., "Luminescent Materials" (Springer-Verlag 1994), both incorporated herein by reference. As shown in FIG. 1, chromaticity coordinates of the prior art blue LEDs used for white emission lie in the circle 1 on the CIE chromaticity diagram in FIG. 1. In other words, the chromaticity coordinates of the LED will be represented by a single point within circle 1, the location of the particular point depending on the peak emission wavelength of the LED.

The chromaticity coordinates of the $YAG:Ce^{3+}$ phosphor are represented by a point along line 3 in FIG. 1, depending on the level of Gd dopant on the Y lattice site and/or the level of Ga dopant on the Al lattice site. For example, the chromaticity coordinates of the YAG phosphor containing a high level of Gd and/or a low level of Ga dopant may be located at point 5, while the chromaticity coordinates of the YAG phosphor containing a low level of Gd and/or a high level of Ga dopant may be located at point 7. Chromaticity coordinates of the YAG phosphor containing intermediate levels of Gd and/or Ga dopants may be located at any point along line 3 between points 5 and 7, such as at points 9, 11, 13 or 15, for example.

The chromaticity coordinates of the combined output of the blue LED and the YAG phosphor may be varied within a fan shaped region on the CIE chromaticity diagram in FIG. 1, bordered by lines 17 and 19. In other words, the combined chromaticity coordinates of the output of the LED and the phosphor may be any point inside the area bordered by circle 1, line 3, line 17 and line 19 in FIG. 1, as described on page 220 of the Nakamura et al. text book. However, the LED—phosphor system described by Nakamura et al. suffers from several disadvantages.

As shown in FIG. 1, the CIE chromaticity diagram contains the well known Black Body Locus ("BBL"), represented by line 21. The chromaticity coordinates (i.e., color points) that lie along the BBL obey Planck's equation: $E(\lambda)=A\lambda^{-5}/(e^{(B/T)}-1)$, where E is the emission intensity, $\lambda$ is the emission wavelength, T the color temperature of the black body and A and B are constants. Various values of the color temperature, T, in degrees Kelvin, are shown on the BBL in FIG. 1. Furthermore, points or color coordinates that lie on or near the BBL yield pleasing white light to a human observer. Typical white light illumination sources are chosen to have chromaticity points on the BBL with color temperatures in the range between 2500K to 7000K. For example, lamps with a point on the BBL with a color temperature of 3900 K are designated "natural white," a color temperature of 3000 K are designated "standard warm white," and so on. However, points or color coordinates that lie away from the BBL are less acceptable as a white light to the human observer. Thus, the LED—phosphor system shown in FIG. 1 contains many points or chromaticity coordinates between lines 17 and 19 that do not yield an acceptable white light for lighting applications.

In order to be useful as a white light source, the chromaticity coordinates LED—phosphor system must lie on or near to the BBL. The color output of the LED—phosphor system varies greatly due to frequent, unavoidable, routine deviations from desired parameters (i.e., manufacturing systematic errors) during the production of the phosphor.

For example, the color output of the LED—phosphor system is very sensitive to the thickness of the phosphor. If the phosphor is too thin, then more than a desired amount of the blue light emitted by the LED will penetrate through the phosphor, and the combined LED—phosphor system light output will appear bluish, because it is dominated by the output of the LED. In this case, the chromaticity coordinates of the output wavelength of the system will lie close to the LED chromaticity coordinates and away from the BBL on the CIE chromaticity diagram. In contrast, if the phosphor is too thick, then less than a desired amount of the blue LED light will penetrate through the thick phosphor layer. The combined LED—phosphor system will then appear yellowish, because it is dominated by the yellow output of the phosphor.

Therefore, the thickness of the phosphor is a critical variable affecting the color output of the system. Unfortunately, the thickness of the phosphor is difficult to control during large scale production of the LED—phosphor system, and variations in phosphor thickness often result in the system output being unsuitable for white light lighting applications or appearing non-white (i.e., bluish or yellowish), which leads to an unacceptably low LED—phosphor system manufacturing yield.

Figure 2:
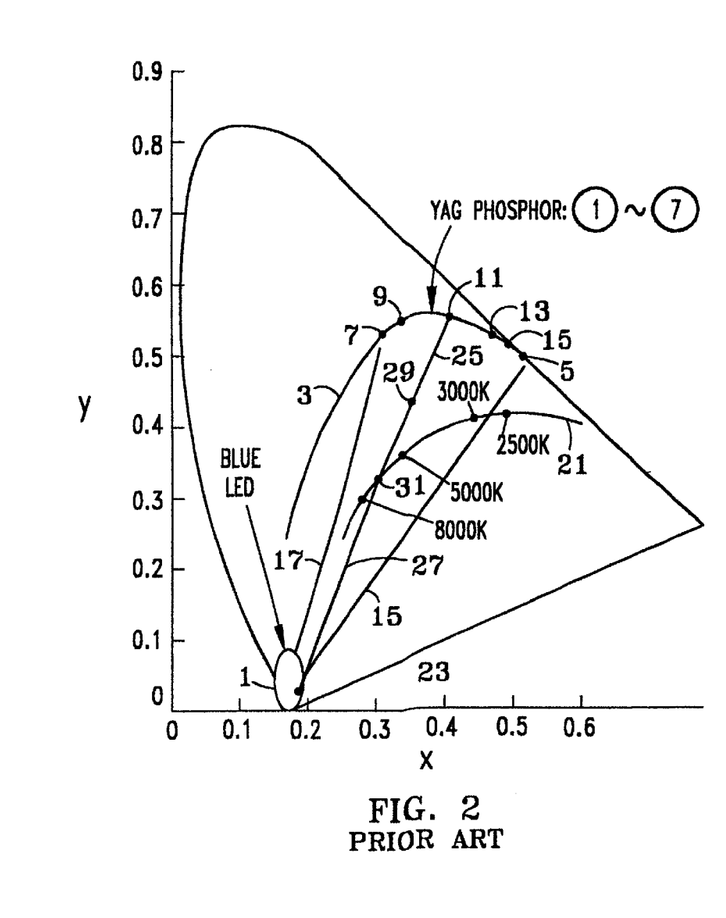

FIG. 2 illustrates a CIE chromaticity diagram containing the chromaticity coordinates at point 11 of a prior art $YAG:Ce^{3+}$ phosphor layer that is placed over a blue LED having chromaticity coordinates at point 23. Thus, the chromaticity coordinates of this system will lie along line 25 connecting points 11 and 23 in FIG. 2. If the phosphor layer is thinner than required to produce white light, then too much of the blue LED light will penetrate through the phosphor layer and the chromaticity coordinates of the system light output will lie near the LED coordinates, such as at point 27, below the BBL. The output of this system will appear bluish. If the phosphor layer is thicker than required to produce white light, then too little of the LED light will be absorbed by the phosphor, and the chromaticity coordinates of the system will lie near the phosphor coordinates, such as at point 29, above the BBL. The output of the system will appear yellowish. The chromaticity coordinates of the system will lie near or on the BBL at point 31 only if the thickness of the phosphor layer is almost exactly equal to the thickness required to produce acceptable white light. Thus, FIG. 2 illustrates the sensitivity of the system color output to variations in the phosphor layer thickness.

Furthermore, the prior art LED—phosphor system suffers from a further deficiency. In order to obtain a white light illumination system with different color temperatures that have color coordinates on or near the BBL (i.e., a system that yields an acceptable white light for illumination purposes), the composition of the phosphor has to be changed. For example, if a prior art system includes a phosphor having a composition whose color coordinates are located at point 11 in FIG. 2, then the LED—phosphor system containing this particular phosphor will have color coordinates near the BBL (i.e., near point 31 on line 27) only for a narrow color temperature range between about 5800 K and 6800 K. The system with this particular phosphor composition does not yield an acceptable white light for lighting applications for color temperatures outside this range. Therefore, the phosphor composition must be changed in order to obtain a system which yields an acceptable white light for lighting applications for desired color temperatures outside the range of 5800 K to 6800 K. The required change in the phosphor composition increases the cost and complexity of the manufacturing process. The present invention is directed to overcoming or at least reducing the problems set forth above.

BRIEF SUMMARY OF THE INVENTION

In accordance with one aspect of the present invention, there is provided a white light illumination system comprising a radiation source and a luminescent material, wherein an emission spectrum of the radiation source represents a first point on a CIE chromaticity diagram, an emission spectrum of the luminescent material represents a second point on the CIE chromaticity diagram and a first line connecting the first point and the second point approximates a Black Body Locus on the CIE chromaticity diagram.

In accordance with another aspect of the present invention, there is provided a white light illumination system, comprising a luminescent material, comprising $(A_{1-x}Gd_x)_3D_5E_{12}$:Ce, wherein A comprises at least one of Y, Lu, Sm and La, D comprises at least one of Al, Ga, Sc and In, E comprises oxygen, x>0.4, and a light emitting diode having a peak emission wavelength greater than 470 nm.

In accordance with another aspect of the present invention, there is provided a method of making a white light illumination system containing a radiation source and a luminescent material, comprising selecting a first line which approximates a Black Body Locus on a CIE chromaticity diagram, forming the radiation source, wherein an emission spectrum of the radiation source is represented by a first point on the first line and forming the luminescent material, wherein an emission spectrum of the luminescent material is represented by a second point on the first line.

DETAILED DESCRIPTION OF THE INVENTION

In view of the problems in the prior art, it is desirable to obtain a white light radiation source—luminescent material illumination system whose color output is less sensitive to errors during the system manufacturing process, especially errors and variations in the thickness of the luminescent material. Furthermore, it is desirable to obtain a white light radiation source—luminescent material illumination system capable of providing an acceptable white light for lighting purposes for a broad range of color temperatures without changing the composition of the luminescent material. Preferably, the radiation source comprises an LED.

The present inventors have discovered that a color output of the LED—luminescent material system is less sensitive to manufacturing errors when the line connecting a point representing the LED chromaticity coordinates with a point representing the luminescent material chromaticity coordinates approximates the BBL on the CIE chromaticity diagram. Furthermore, such a system is capable of providing an acceptable white light for lighting purposes for a broad range of color temperatures without changing the composition of the luminescent material.

The term luminescent material includes a luminescent material in powder form (a phosphor) and in solid body form (scintillator). The term "LED chromaticity coordinates" refers to the chromaticity coordinates of the LED emission spectrum on the CIE chromaticity diagram. The term "luminescent material chromaticity coordinates" refers to the chromaticity coordinates of the emission spectrum of the luminescent material on the CIE chromaticity diagram.

Figure 3:
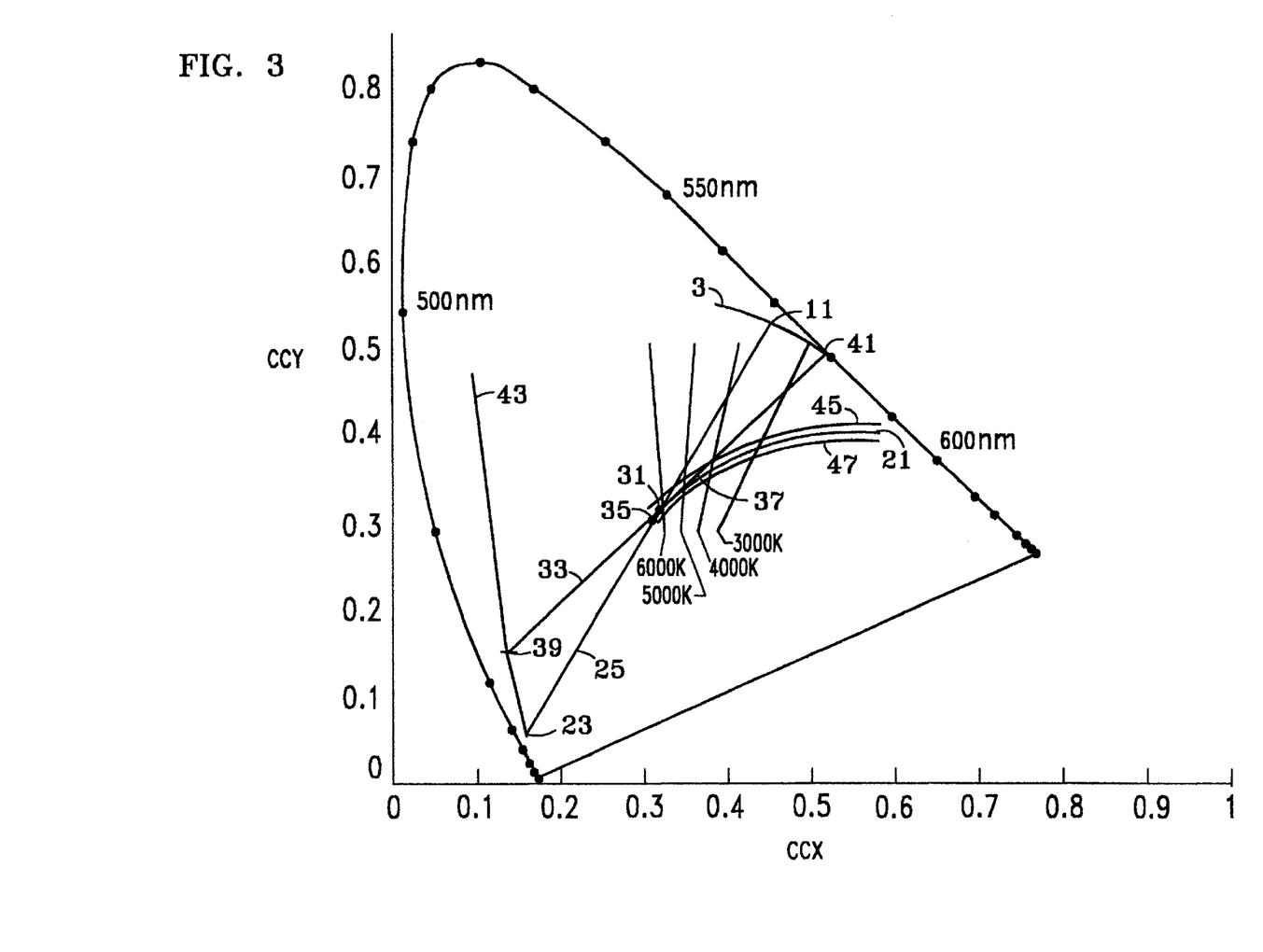
FIGS. 3 and 5 are CIE chromaticity diagrams of illumination systems according to the preferred embodiments of the present invention.
Figure 4:
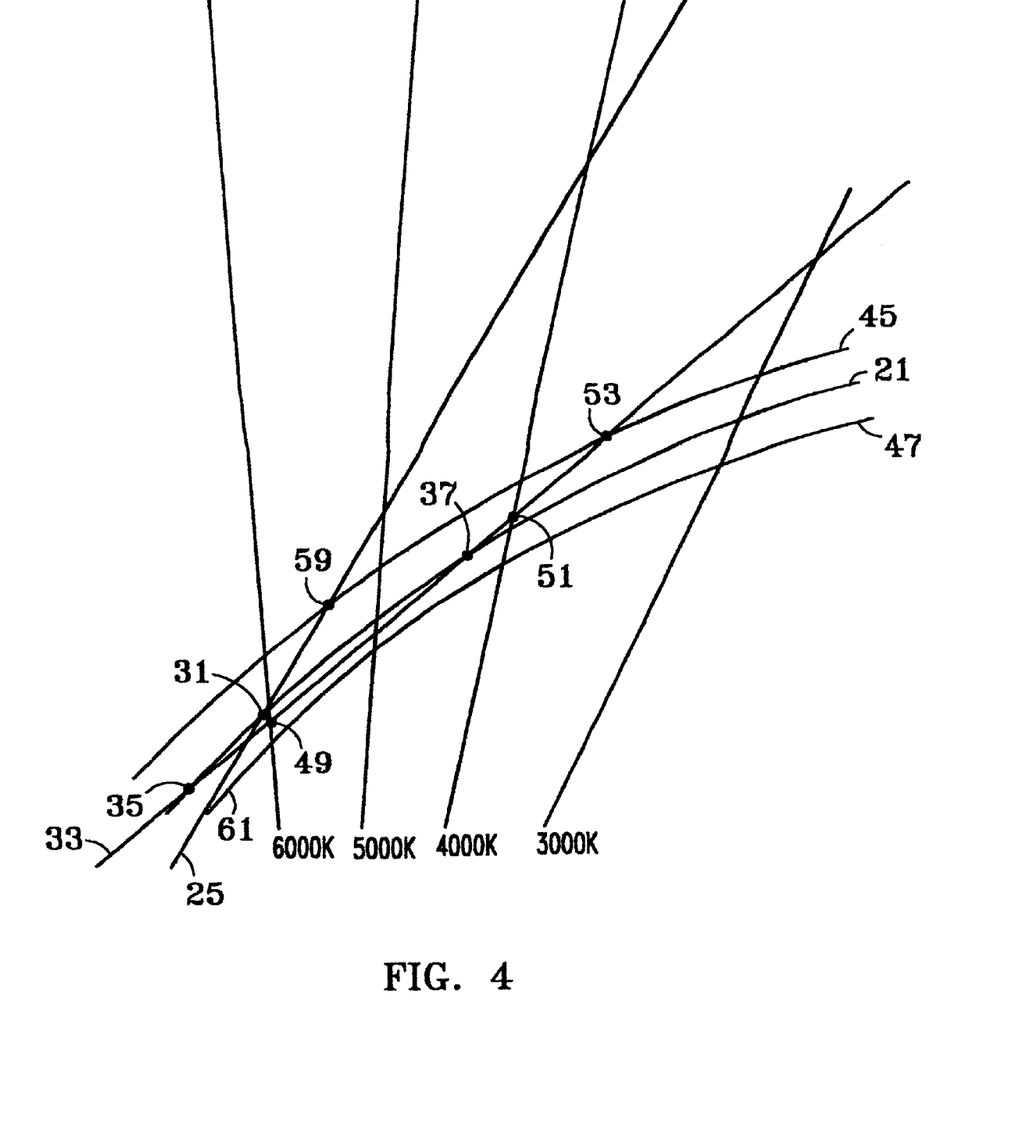
FIGS. 4 and 6 are close up views of a center region of CIE chromaticity diagrams of illumination systems according to the preferred embodiments of the present invention.

The line connecting the LED and luminescent material chromaticity coordinates may approximate the BBL curve in many different ways. In one preferred embodiment of the present invention, a line which intersects the BBL curve twice approximates the BBL curve, as illustrated in FIGS. 3 and 4. FIG. 4 is a close up of the middle portion of FIG. 3. For example, a line 33 may intersect the BBL curve 21 twice at points 35 and 37. Line 33 connects the LED chromaticity coordinates 39 to the luminescent material chromaticity coordinates 41. Of course, line 33 is shown for illustration purposes only. There may be many other lines which connect various LED chromaticity coordinates to various luminescent material chromaticity coordinates and which intersect the BBL curve twice. For example, the slope of the line may be varied by varying the peak emission wavelength, and thus the chromaticity coordinates, of the LED along line 43 or by varying the peak luminescent material emission wavelength along line 3.

A white light source that is considered acceptable for lighting applications is typically within +/−0.01 y-units of the BBL and preferably within +/−0.005 y-units of the BBL. A "y-unit" is a unit along the y-axis of the CIE chromaticity diagram. A line, such as line 33, which intersects the BBL curve twice approximates the BBL curve because many points on this line are 0.01 y-units or less away from the BBL curve, and preferably 0.005 y-units or less away from the BBL curve.

For example, any point on line 33 between about 7000K and 3500K appears white to the human observer and corresponds to an acceptable white light source, because these points are located between lines 45 and 47, which delineate the space on the CIE chromaticity diagram containing chromaticity coordinates which are 0.01 y-units or less from the BBL curve 21.

Preferably, the line 33 intersects the BBL curve such that it contains two points which correspond to color temperatures at least 2000 K apart and which are 0.01 y-units or less from the BBL curve 21, as illustrated in FIG. 4. For example, points 49 and 51 corresponding to temperatures of about 6000 K and 4000 K, respectively, are located on line 33, 0.01 y-units or less from the BBL curve 21. The points that lie on line 33 between points 49 and 51 are also located between lines 45 and 47, within 0.01 y-units from the BBL curve, as illustrated in FIG. 4. Thus, all these points correspond to an acceptable white light source for lighting applications. Furthermore, it is possible to obtain a white light illumination system with a broad range of color temperatures without changing the composition of the luminescent material, by selecting a system having color coordinates at any point on line 33 corresponding to color temperatures of about 10,800K and 3800K (point 53).

Figure 5:
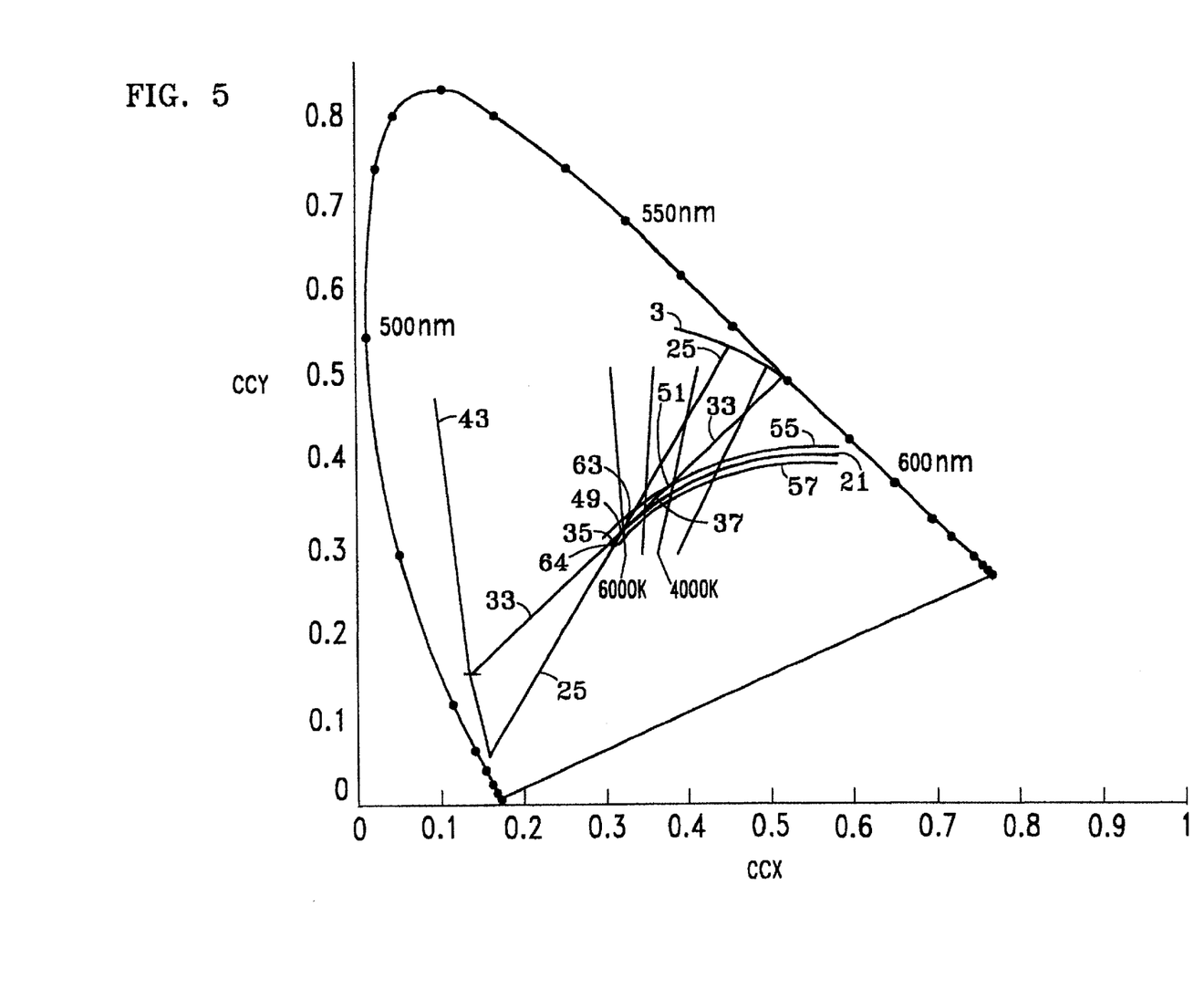

Most preferably, the line 33 intersects the BBL curve such that it contains two points which correspond to color temperatures at least 2000 K apart and which are 0.005 y-units or less from the BBL curve 21, as illustrated in FIG. 5. For example, points 49 and 51 corresponding to temperatures of about 6000 K and 4000 K, respectively, are located on line 33, 0.005 y-units or less from the BBL curve 21. The points that lie on line 33 between points 49 and 51 are also located between lines 55 and 57, within 0.005 y-units from the BBL curve, as illustrated in FIG. 5. Thus, all these points correspond to an acceptable white light source for lighting applications.

In contrast, the majority of color coordinates between 4000K and 6000K along the prior art line 25 are not located within 0.01 y-units from the BBL. For example, only the color coordinates between about 5200K (point 59 in FIG. 4) and 6400 K (point 61 in FIG. 4) on the prior art line 25 are located within 0.01 y-units from the BBL. Furthermore, only the color coordinates between about 5770K (point 63 in FIG. 5) and 6780 K (point 64 in FIG. 5) on the prior art line 25 are located within 0.005 y-units from the BBL. The accessible color coordinates with correlated color temperature below 5200K (above point 59) are located more than 0.01 y-units from the BBL (i.e., above line 45 delineating the 0.01 y-unit distance from the BBL). The points on line 25 above point 59, therefore, do not correspond to an acceptable white light source for lighting applications. Therefore, the prior art system is more sensitive to manufacturing error than the system of the first preferred embodiment of the present invention. Furthermore, the composition of the phosphor of the prior art system has to be changed in order to obtain a system having color coordinates corresponding to color temperatures outside the 5200 to 6400 K range, that is acceptable for lighting applications.

Figure 6:
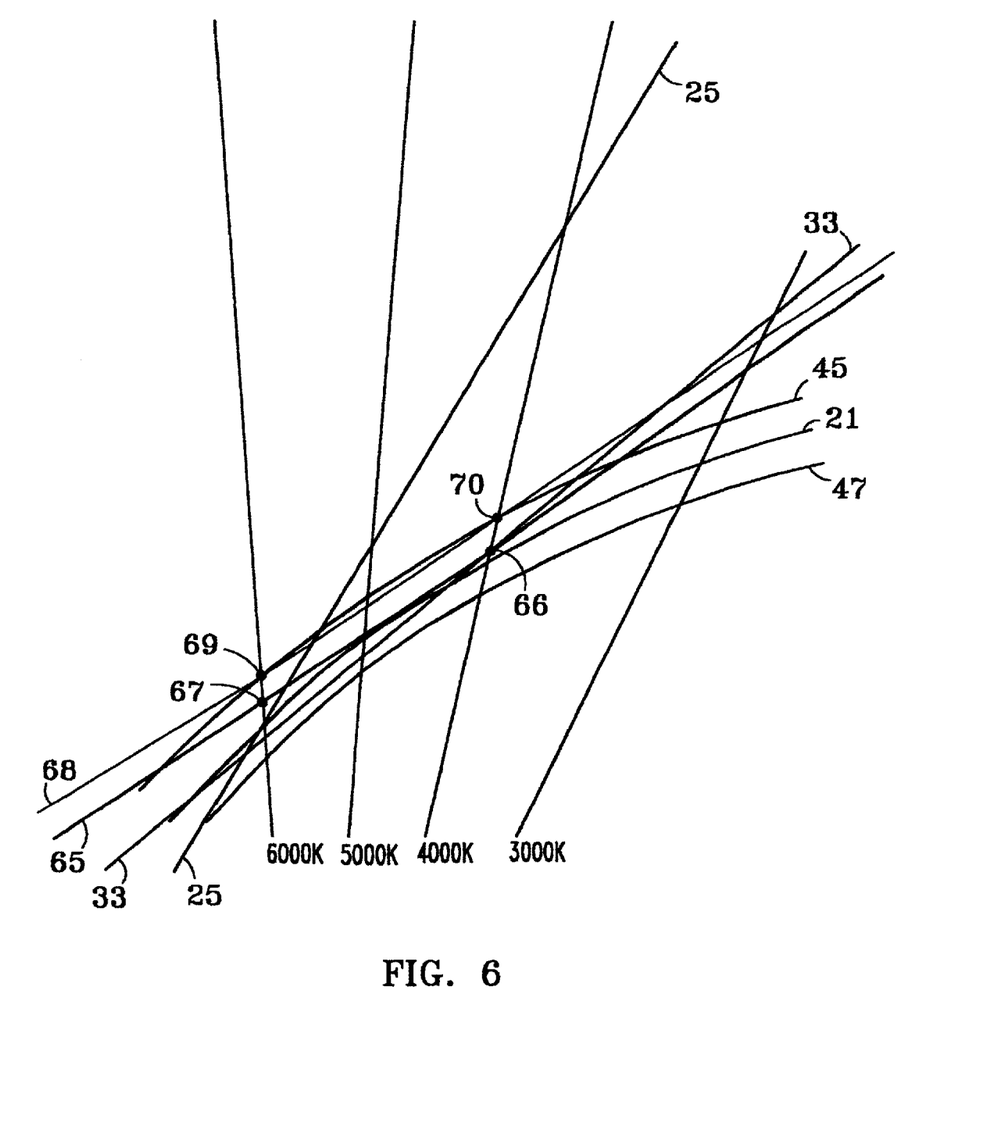

In a second preferred embodiment of the present invention, a line which approximates the BBL curve is tangential to the BBL curve, as illustrated in FIG. 6. For example, line 65 is tangential to the BBL curve 21. Of course, line 65 is shown for illustration purposes only. There may be many other lines which connect various LED chromaticity coordinates to various luminescent material chromaticity coordinates and which are tangential to the BBL curve. For example, the slope of the line may be varied by varying the peak emission wavelength of the LED along line 43 or by varying the luminescent material peak emission wavelength along line 3.

A line, such as line 65, which is tangential to the BBL curve approximates the BBL curve because many points on this line are 0.01 y-units or less, and preferably 0.005 y-units or less away from the BBL curve. For example, any point on line 65 between about 6500K and 3500K corresponds to an acceptable white light, because these points are located between lines 45 and 47. Preferably, the line 65 is tangential to the BBL curve such that it contains two points which correspond to color temperatures at least 2000 K apart and which are 0.01 y-units or less, and preferably 0.005 y-units or less from the BBL curve 21. For example, the points that lie on line 65 on the CIE chromaticity diagram between points corresponding to color temperatures of 4000 K and 6000 K would be located between lines 45 and 47 in FIG. 6. In other words, all the points on line 65 between points 66 and 67 are located within 0.01 y-units from the BBL, i.e., between lines 45 and 47, as illustrated in FIG. 6. Thus, all points on line 65 between points 66 and 67 correspond to white light acceptable for lighting applications.

In a third preferred embodiment of the present invention, a line which approximates the BBL curve contains two points which are at least 2000 K apart and are located 0.01 y-units or less from the BBL curve. For example, as illustrated in FIG. 6, line 68 contains two points, 69 and 70, which correspond to color temperatures of 6000 and 4000 K, respectively, which are located 0.01 y-units or less from the BBL curve (i.e., points 69 and 70 are located between lines 45 and 47). Of course, line 68 is shown for illustration purposes only. There may be many other lines which connect various LED chromaticity coordinates to various luminescent material chromaticity coordinates and which contain two points at least 2000 K apart that are 0.01 y-units or less from the BBL curve. For example, the slope of the line may be varied by varying the peak emission wavelength of the LED along line 43 or by varying the peak luminescent material emission wavelength along line 3. Furthermore, a line which approximates the BBL curve may be located between the BBL curve 21 and line 47.

It should be noted that lines may approximate the BBL curve in ways other than described in the first, second and third preferred embodiments. Preferably, the CIE color coordinates of the radiation emitted by the LED—luminescent material system range from x=0.31 and y=0.33 (T=6700 K or "daylight") to x=0.44 and y=0.4 (T=3000 K or "standard warm white"). However, the radiation emitted by the system may have other coordinates that are considered to correspond to white color, if desired.

In a first preferred aspect of the present invention, the luminescent material comprises $(A_{1-x}Gd_x)_3D_5E_{12}$:Ce, where A comprises at least one of Y, Lu, Sm and La; D comprises at least one of Al, Ga, Sc and In; E comprises oxygen and x>0.4. In a second preferred aspect of the present invention, the light emitting diode preferably comprises a light emitting diode having a peak emission wavelength greater than 470 nm. Preferably, the peak emission wavelength is between 470 and 500 nm and most preferably, between 475 and 480 nm, such as 478 nm. In a third preferred aspect of the present invention, the white light illumination system contains the luminescent material of the first preferred aspect and the light emitting diode of the second preferred aspect.

In the luminescent material of the first preferred aspect, Ce ions act as the activator ions, and are responsible for the emission of yellow light from the luminescent material. The Gd ions affect the color (i.e., the color coordinates) of the output of the illumination system. The present inventors have determined that when the atomic ratio (i.e., "x") of Gd ions is greater than 0.4, the color coordinates of the light emitted from the luminescent material allow a line connecting these coordinates to the LED color coordinates to approximate the BBL curve. For example, the $(A_{1-x}Gd_x)_3D_5E_{12}$:Ce luminescent material having x>0.4 emits light with color coordinates approximately between points 5 and 15 in FIG. 1. The high Gd content decreases the efficiency of the luminescent material by a few percent compared to a luminescent material containing little or no Gd. However, the improvement in the illumination system manufacturing yield achievable by increasing the Gd content offsets the small decrease in system efficiency.

Preferably, the luminescent material contains no or trace amounts of Ga and comprises $(Y_{1-x-z}Gd_xCe_z)_3Al_5O_{12}$, where 0.7>x>0.4 and 0.1>z>0. However, the value of "x" may be increased up to 0.8, if desired. The luminescent material may contain other elements, such as small amounts of fluorine, if a fluorine based flux such an ammonium fluoride, $YF_3$ or $AlF_3$ is used during the fabrication of the luminescent material. Most preferably, the luminescent material comprises a $(Y_{0.37}Gd_{0.6}Ce_{0.03})_3Al_5O_{12}$ phosphor. However, the luminescent material may comprise a scintillator, if desired.

The LED of the second preferred aspect may comprise any LED having a peak emission wavelength of greater than 470 nm and which is capable of producing white light when its emitted radiation is directed onto a luminescent material. In other words, the LED may comprise a semiconductor diode based on any suitable III–V, II–VI or IV—IV semiconductor layers. Preferably, the LED may contain at least one semiconductor layer comprising GaN, ZnSe or SiC. Most preferably, the LED comprises a single quantum well LED having an InGaN p-n junction having a peak emission wavelength greater than 470 nm but less than 500 nm. However, multiple quantum well LEDs or LEDs without quantum wells could also be used. A peak emission wavelength between 475 and 480 nm, such as 478 nm is most preferred. A peak emission wavelength between 470 and 500 nm along line 43 in FIGS. 3 and 5 allows a line connecting the LED color coordinates to the luminescent material color coordinates to approximate the BBL curve.

Most preferably, according to the third preferred aspect of the present invention, the luminescent material comprises $(A_{1-x}Gd_x)_3D_5E_{12}$:Ce where x>0.4 and the LED peak emission wavelength is greater than 470 nm to allow a line connecting the color coordinates of the luminescent material and the LED to approximate the BBL curve, as described above with respect to the first, second and third preferred embodiments. Furthermore, the luminescent material whose light output color coordinates are illustrated in FIGS. 3–6 comprises $(A_{1-x}Gd_x)_3D_5E_{12}$:Ce where x>0.4, and the LED whose color coordinates are also illustrated in FIGS. 3–6 has a peak emission wavelength greater than 470 nm to allow lines 33, 65 and 68 to approximate the BBL curve 21 in FIGS. 3–6.

In contrast, the prior art LED—phosphor white light illumination systems utilized blue LEDs with a preferred peak emission wavelength of at most 465 nm, as shown by circle 1 in FIGS. 1 and 2. Furthermore, YAG:Ce³⁺ phosphors with a high Gd content were not preferred in the prior art because the high Gd content decreased the efficiency of the system by a few percent compared to phosphors with low Gd content. In such prior art systems, the line connecting the phosphor and LED color coordinates did not approximate the BBL curve.

The illumination system according to the preferred aspects of the present invention, illustrated in Table 1 is compared to the prior art illumination system disclosed in the Nakamura text book, illustrated in Table 2, below:

TABLE 1

System = LED with 478 nm emission + $(Y_{0.37}Gd_{0.6}Ce_{0.03})_3Al_5O_{12}$ phosphor

| COLOR TEMPERATURE | COLOR COORDINATE DISTANCE FROM BBL (Y-UNITS) |
|---|---|
| 3800 K | 0.005 |
| 4000 K | 0.003 |
| 5000 K | −0.003 |
| 6000 K | −0.004 |
| 7000 K | −0.002 |
| 8000 K | −.00009 |
| 9000 K | 0.002 |
| 10,000 K | 0.004 |
| 10,800 K | 0.005 |

TABLE 2

Prior Art System = LED with 460 nm emission + $(Y_{0.97}Ce_{0.03})_3Al_5O_{12}$ phosphor

| COLOR TEMPERATURE | COLOR COORDINATE DISTANCE FROM BBL (Y-UNITS) |
|---|---|
| 4000 K | 0.072 |
| 5000 K | 0.020 |
| 5800 K | 0.005 |
| 6000 K | 0.002 |
| 6800 K | −.0005 |

As calculated in tables 1 and 2, an exemplary system according to the preferred embodiments of the present invention emits light with color coordinates within 0.01 y-units, and preferably within 0.005 y-units from the BBL for a wider color temperature range (about 3,800 to 10,800 K) than a system according to the prior art (about 5,800 to 6,800K). Thus, the system according to the preferred embodiments of the present invention will be less sensitive to errors and variations in the luminescent material thickness than the prior art system. This leads to an improved manufacturing yield for a system manufactured according to the present invention compared to the prior art system.

For example, assume that the desired color of the light emitted by the system corresponds to the color coordinates located near points 31 and 49 in FIG. 4. In order to obtain the desired color, the luminescent material thickness should be equal to a predetermined value. However, due to manufacturing error, the luminescent material may be fabricated with a thickness greater than the predetermined value.

A greater than desired luminescent material thickness results in the system color coordinates being shifted toward the luminescent material color coordinates (i.e., toward line 3 in FIG. 3) along the line connecting the luminescent material color coordinates with the LED color coordinates. For example, the color coordinates of the system according to the first preferred embodiment will be shifted from point 49, along line 33 toward point 41 on line 3 in FIG. 3. Likewise, the color coordinates of the prior art system will be shifted from point 49, along line 25 toward point 11 on line 3.

As is illustrated in FIGS. 3 and 4, the system of the first preferred embodiment allows a greater deviation than the prior art system in luminescent material thickness from the predetermined value while maintaining an acceptable white system color output. For example, the deviation in thickness may shift the color coordinates of system of the first preferred embodiment all the way to point 53 where line 33 intersects line 45, while still retaining an acceptable white color system output (i.e., the system color coordinates remain between lines 45 and 47). In contrast, the deviation in thickness may shift the color coordinates of the prior art system only to point 59, while still retaining a white color system output that is suitable for lighting applications. Any further deviation in thickness will cause the output of the prior art system to become unsuitable for lighting applications (i.e. the system color coordinates will be located between points 59 and 11, above line 45 in FIGS. 3–4).

The same advantages over the prior art system may also be obtained for other preferred embodiments of the present invention and also when the luminescent material thickness is below the predetermined value. In this case, the color coordinates will merely shift to the left (toward line 43) instead of toward the right (toward line 3). Furthermore, a system according to the preferred embodiments of the present invention is capable of providing an acceptable white light for lighting purposes for a broader range of color temperatures than the prior art system, without changing the composition of the luminescent material.

Figure 7:
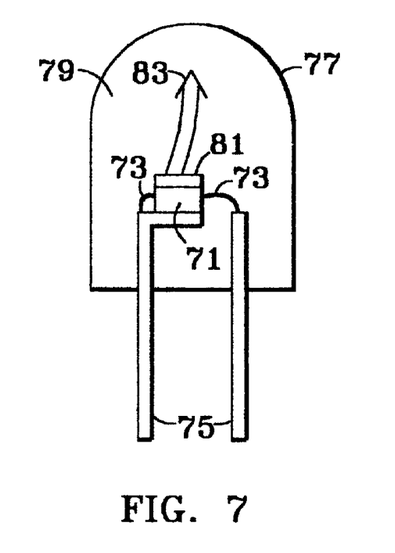
FIGS. 7–9 are a cross-sectional schematic views of the preferred structures of an illumination system of the present invention.

The white light illumination system according to the preferred aspects of the present invention may have various different structures. One preferred structure is schematically illustrated in FIG. 7. The illumination system includes an LED chip 71 and leads 73 electrically attached to the LED chip. The leads 73 may comprise thin wires supported by a thicker lead frame(s) 75 or the leads may comprise self supported electrodes and the lead frame may be omitted. The leads 73 provide current to the LED chip 71 and thus cause the LED chip 71 to emit radiation, such as blue or blue-green light having a wavelength between 470 and 500 nm.

The LED chip 71 is preferably encapsulated within a shell 77 which encloses the LED chip and an encapsulant material 79. The shell 77 may be, for example, transparent glass or plastic. The encapsulant material may be, for example, an epoxy or a polymer material, such as silicone. However the shell or the encapsulating material may be omitted to simplify processing. Furthermore, the shell may comprise an opaque bottom portion and a transparent top portion comprising glass, plastic or an opening. Furthermore, the shell 77 may have any desired shape in addition to the shape shown in the Figures. The LED chip 71 may be supported, for example, by the lead frame 75, by the self supporting electrodes, by the bottom of the shell 77 or by a pedestal mounted to the shell or to the lead frame.

The first preferred structure of the illumination system includes a luminescent material 81. The luminescent material may comprise the $(A_{1-x}Gd_x)_3D_5E_{12}$:Ce phosphor or scintillator where x>0.4 formed adjacent the LED chip. If the luminescent material 81 is a phosphor, then the phosphor may be coated over or directly on the light emitting surface of the LED chip 71. If the luminescent material 81 is a solid scintillator, then the scintillator may be affixed to or over the light emitting surface of the LED chip 71. Both the shell 77 and the encapsulant 79 should be transparent to allow white light 83 to be transmitted through those elements.

Figure 8:
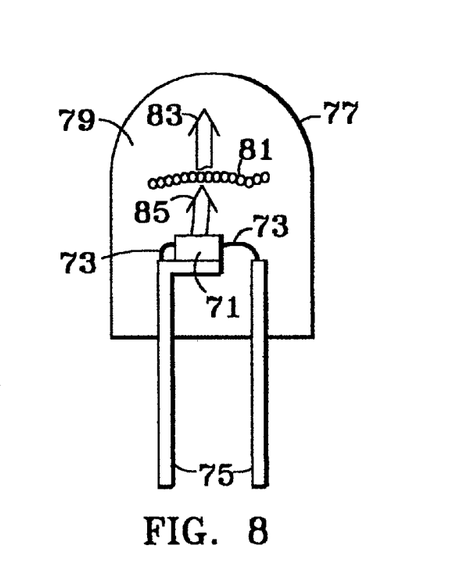

FIG. 8 illustrates a second preferred structure of the present invention. The structure of FIG. 8 is the same as that of FIG. 7, except that the luminescent material 81 is interspersed within the encapsulant material 79, instead of being formed over the LED chip 71. The luminescent material 81 may comprise a phosphor powder which is interspersed within a single region of the encapsulant material 79 or throughout the entire volume of the encapsulant material.

The blue or blue-green light 85 emitted by the LED chip 71 is mixed with the yellow light emitted by the phosphor 81 to appear as white light 83.

Figure 9:
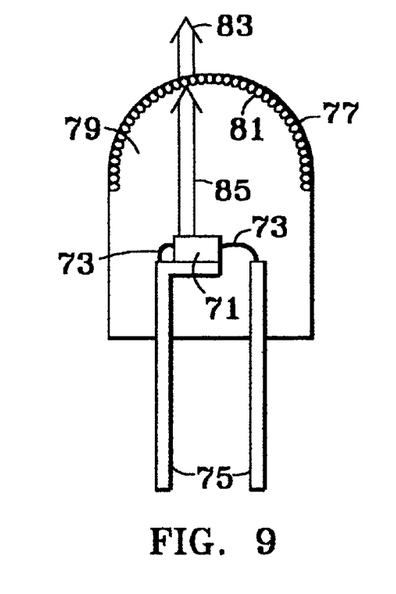

FIG. 9 illustrates a third preferred structure of the present invention. The structure of FIG. 9 is the same as that of FIG. 7, except that the luminescent material 81 is coated on the shell 77, instead of being formed over the LED chip 71. The luminescent material 81 is preferably a phosphor that is coated on the inside surface of the shell 77, although the luminescent material may be coated on the outside surface of the shell, if desired. The phosphor 81 may be coated on the entire surface of the shell or only a top portion of the surface of the shell. The blue or blue-green light 85 emitted by the LED chip 71 is mixed with the yellow light emitted by the phosphor 81 to appear as white light 83.

Alternatively, the shell 77 may be made of the luminescent material 81 in scintillator form. Of course, the embodiments of FIGS. 7–9 may be combined and the luminescent material may be located in any two or all three locations or in any other suitable location, such as separately from the shell or integrated into the LED.

According to a fourth preferred embodiment of the present invention, the white light illumination system is made by the following method. First, a line which approximates the BBL is selected. For example, a line according to the first, second or third preferred embodiment of the present invention approximates the BBL. However, other lines which approximate the BBL may be selected. Based on the selected line, an LED is formed having an emission spectrum that is represented by a point on the line that approximates the BBL. Furthermore, based on the selected line, a luminescent material is formed having an emission spectrum that is represented by another point on the line that approximates the BBL.

In the method of the fourth preferred embodiment, the term "formed" or "forming" refers both to manufacturing an LED and/or a luminescent material, as well as placing an existing LED and/or an existing luminescent material into the white light illumination system. For example, an LED may be "formed" as part of a system by selecting or buying an existing LED that has a peak emission wavelength that is represented by a point on the line that approximates the BBL and then placing the LED into the white light illumination system. The LED chip may be placed into the shell and connected to the leads. Furthermore, a plurality of LEDs and/or luminescent materials may be formed based on a single line that approximates the BBL. For example, after selecting a single line that approximates the BBL, a plurality of LEDs and/or luminescent materials may be manufactured or selected and placed into the illumination system based on the single selected line.

The phosphor form of the luminescent material may be made, for example, by any ceramic powder method, such as a liquid phase (flux) method or a solid state method. Preferably, the method of making the phosphor comprises the following steps. First, the starting compounds of the phosphor material are mixed in a crucible or another suitable container, such as a ball mill, to form a first composite powder. The preferred starting phosphor compounds comprise stoichiometric amounts of cerium oxide, $CeO_2$, gadolinium oxide, $GdO_2$ yttrium oxide, $Y_2O_3$, and alumina, $Al_2O_3$. If desired, a flux, such as ammonium fluoride, yttrium fluoride, $YF_3$ and/or aluminum fluoride, $AlF_3$, which improves the phosphor luminosity and efficiency, may also be added, preferably at a concentration of 0.02–0.2 mole percent per mole of the phosphor produced. Use of a flux results in a small amount of residual fluorine to be included in the YAG:Ce:Gd phosphor. Alternatively, the rare earth elements may be co-precipitated from an acid solution to form a composite rare earth oxide powder which is then mixed with the alumina powder and optionally with the flux, such as $AlF_3$.

The blended first powder is then sintered in a furnace or in a crucible for between about 2 and 10 hours at 1000 to 1600° C., preferably for six hours at 1500° C., to form a sintered body or cake. The sintering preferably takes place in a reducing atmosphere, such as in forming gas or in charcoal vapors, if the $AlF_3$ flux is used. The sintered body is then milled to form a second powder. Preferably, the second powder is milled until it has a mean particle size of about 6 microns. The second powder is preferably milled in propanol or water as the milling media and subsequently dried. However, other milling media, such as methanol, for example, may be used instead.

The second powder is then placed into the white light illumination system. The second powder may be placed over the LED chip, interspersed into the encapsulant material or coated onto the surface of the shell, as described above with respect to the first, second and third preferred structures of the present invention. Preferably, a suspension of the second powder and a liquid is used to coat the LED chip or the shell surface. The suspension may also optionally contain a binder in a solvent. Preferably, the binder comprises an organic material, such as nitrocellulose, in a solvent such as butyl acetate, amyl acetate, methyl propanol or propylene glycol mono-methyl ether acetate at a 90–95% level with 1–2% denatured ethanol. The binder enhances the adhesion of the powder particles to each other and to the LED or the shell. However, the binder may be omitted to simplify processing, if desired. After coating, the suspension is dried and may be heated to evaporate the binder. The coated second powder acts as the phosphor after drying the solvent.

If the phosphor is to be interspersed within the encapsulant material, then the phosphor may be added as a second powder to a polymer precursor, and then the polymer precursor may be cured to solidify the polymer material. Alternatively, the second powder may be mixed in with the epoxy encapsulant. Other phosphor interspersion methods may also be used.

The scintillator form of the luminescent material may be made by any scintillator fabrication method. For example, the scintillator may be formed by Czochralski, float zone, or other crystal growing methods. The scintillator may then be placed over the LED chip or used as the shell or as a top portion of the shell.

The radiation source of the white light illumination system has been described above as a semiconductor light emitting diode. However, the radiation source of the present invention is not limited to a semiconductor light emitting diode. For example, the white light illumination system may comprise a laser diode, an organic light emitting diode (OLED), a plasma display device or a fluorescent lamp. The radiation source may comprise a gas which produces a radiative discharge in response to collisions with charged particles emitted by an electrode. The radiation emitted by the gas is incident on the luminescent material coated on a portion of the system, which causes the luminescent material to emit yellow light. The yellow light mixed with the radiation produced by the gas appears white to the observer.

Furthermore, the preferred system described above contains a single radiation source and a single luminescent material. However, if desired, plural radiation sources and/or plural luminescent materials having different emission color coordinates may be used in the system in order to improve the emitted white light or to combine the emitted white light with a light of a different color(s). For example, the white light emitting system may be used in combination with red, green and/or blue light emitting diodes in a display device.

The preferred embodiments have been set forth herein for the purpose of illustration. However, this description should not be deemed to be a limitation on the scope of the invention. Accordingly, various modifications, adaptations, and alternatives may occur to one skilled in the art without departing from the spirit and scope of the claimed inventive concept.

What is claimed is:

1. A white light illumination system comprising a radiation source and a luminescent material, wherein:

an emission spectrum of the radiation source represents a first point on a CIE chromaticity diagram;

an emission spectrum of the luminescent material represents a second point on the CIE chromaticity diagram;

a first line connecting the first point and the second point approximates a Black Body Locus on the CIE chromaticity diagram; and radiation emitted by the system approximates the Black Body Locus on the CIE chromaticity diagram substantially independent of a thickness of the luminescent material for color temperatures ranging from 4000 K to 6000 K.

2. The system of claim 1, wherein the radiation source comprises a light emitting diode.

3. The system of claim 2, wherein the first line intersects the Black Body Locus twice.

4. The system of claim 2, wherein the first line is tangential to the Black Body Locus.

5. The system of claim 2, wherein:

a third point and a fourth point on the first line are located less than 0.01 y-units away from the Black Body Locus on the CIE chromaticity diagram;

the third point corresponds to a first color temperature; and the fourth point corresponds to a second color temperature which is at least 2000 K greater than the first color temperature.

6. The system of claim 5, wherein the third point and the fourth point on the first line are located less than 0.005 y-units away from the Black Body Locus on the CIE chromaticity diagram.

7. The system of claim 6, wherein the first color temperature is 4000 K and the second color temperature is 6000K.

8. The system of claim 2, wherein:

a) the luminescent material comprises:
      $(A_{1-x}Gd_x)_3D_5E_{12}$:Ce,
      wherein A comprises at least one of Y, Lu, Sm and La;
      D comprises at least one of Al, Ga, Sc and In;
      E comprises oxygen; and
      x>0.4; and b) a peak emission wavelength of the light emitting diode is greater than 470 nm.

9. The system of claim 8, wherein the luminescent material comprises $(Y_{1-x-z}Gd_xCe_z)_3Al_5O_{12}$; 0.7>x>0.4; and 0.1>z>0.

10. The system of claim 9, wherein the luminescent material further contains fluorine.

11. The system of claim 9, wherein the luminescent material comprises a $(Y_{0.37}Gd_{0.6}Ce_{0.03})_3Al_5O_{12}$ phosphor.

12. The system of claim 8 wherein the light emitting diode contains at least one semiconductor layer comprising GaN, ZnSe and SiC having a peak emission wavelength greater than 470 nm but less than 500 nm.

13. The system of claim 12, wherein the light emitting diode peak emission wavelength is 475 to 480 nm.

14. The system of claim 12, wherein the light emitting diode comprises an InGaN p-n junction.

15. The system of claim 8, wherein:
the luminescent material comprises $(Y_{1-x-z}Gd_xCe_z)_3Al_5O_{12}$; $0.7>x>0.4$; and $0.1>z>0$; and
the light emitting diode peak emission wavelength is greater than 470 nm but less than 500 nm.

16. The system of claim 15, further comprising a shell containing the light emitting diode and an encapsulating material between the shell and the light emitting diode, and wherein:
a) the luminescent material is phosphor coated over a surface of the light emitting diode;
b) the luminescent material is phosphor interspersed in the encapsulating material;
c) the luminescent material is a phosphor coated onto the shell; or
d) the luminescent material is a scintillator overlying a surface of the light emitting diode.

17. The system of claim 2, wherein the CIE color coordinates of a radiation emitted by the system range from $x=0.31$ and $y=0.33$ to $x=0.44$ and $y=0.4$.

18. The system of claim 1, wherein the radiation source comprises one of a laser diode or a radiative gas discharge in a plasma display or in a fluorescent lamp.

19. A white light illumination system comprising:
a) a luminescent material, comprising:
$(A_{1-x}Gd_x)_3D_5E_{12}$:Ce,
wherein A comprises at least one of Y, Lu, Sm and La;
D comprises at least one of Al, Ga, Sc and In;
E comprises oxygen; and
$x>0.4$;
b) a light emitting diode having a peak emission wavelength greater than 470 nm; and
wherein radiation emitted by the system approximates a Black Body Locus on a CIE chromaticity diagram substantially independent of a thickness of the luminescent material for color temperatures ranging from 4000 K to 6000 K.

20. The system of claim 19, wherein the luminescent material consists essentially of $(Y_{1-x-z}Gd_xCe_z)_3Al_5O_{12}$; $0.7>x>0.4$; and $0.1>z>0$.

21. The system of claim 20, wherein the luminescent material further contains fluorine.

22. The system of claim 20, wherein the luminescent material comprises a $(Y_{0.37}Gd_{0.6}Ce_{0.03})_3Al_5O_{12}$ phosphor.

23. The system of claim 19, wherein the light emitting diode comprises an InGaN p-n junction having a peak emission wavelength greater than 470 nm but less than 500 nm.

24. The system of claim 23, wherein the light emitting diode peak emission wavelength is 475 to 480 nm.

25. The system of claim 19, wherein:
the luminescent material comprises $(Y_{1-x-z}Gd_xCe_z)_3Al_5O_{12}$; $0.7>x>0.4$; and $0.1>z>0$; and
the light emitting diode peak emission wavelength is greater than 470 nm but less than 500 nm.

26. The system of claim 25, further comprising a shell containing the light emitting diode and an encapsulating material between the shell and the light emitting diode, and wherein:

a) the luminescent material is a phosphor coated over a surface of the light emitting diode;
b) the luminescent material is a phosphor interspersed in the encapsulating material;
c) the luminescent material is a phosphor coated onto the shell; or
d) the luminescent material is a scintillator overlying a surface of the light emitting diode.

27. The system of claim 20, wherein CIE color coordinates of a radiation emitted by the system range from $x=0.31$ and $y=0.33$ to $x=0.44$ and $y=0.4$.

28. A method of making a white light illumination system containing a radiation source and a luminescent material, comprising:
selecting a first line which approximates a Black Body Locus on a CIE chromaticity diagram;
forming the radiation source, wherein an emission spectrum of the radiation source is represented by a first point on the first line; and
forming the luminescent material, wherein an emission spectrum of the luminescent material is represented by a second point on the first line.

29. The method of claim 28, wherein the radiation source comprises a light emitting diode.

30. The method of claim 29, wherein the first line intersects the Black Body Locus twice.

31. The method of claim 29, wherein the first line is tangential to the Black Body Locus.

32. The method of claim 29, wherein:
a third point and a fourth point on the first line are located less than 0.01 y-units away from the Black Body Locus on the CIE chromaticity diagram;
the third point corresponds to a first color temperature; and
the fourth point corresponds to a second color temperature which is at least 2000 K greater than the first color temperature.

33. The method of claim 32 wherein:
the third point and the fourth point on the first line are located less than 0.005 y-units away from the Black Body Locus on the CIE chromaticity diagram.

34. The method of claim 33, wherein the first color temperature is 4000 K and the second color temperature is 6000K.

35. The method of claim 29, wherein:
a) the luminescent material comprises:
$(A_{1-x}Gd_x)_3D_5E_{12}$:Ce,
wherein A comprises at least one of Y, Lu, Sm and La;
D comprises at least one of Al, Ga, Sc and In;
E comprises oxygen; and
$x>0.4$; and
b) a peak emission wavelength of the light emitting diode is greater than 470 nm.

36. The method of claim 35, wherein:
the luminescent material comprises $(Y_{1-x-z}Gd_xCe_z)_3Al_5O_{12}$; $0.7>x>0.4$; and $0.1>z>0$; and
the light emitting diode peak emission wavelength is greater than 470 nm but less than 500 nm.

37. The method of claim 36, wherein the luminescent material comprises a $(Y_{0.37}Gd_{0.6}Ce_{0.03})_3Al_5O_{12}$ phosphor and the light emitting diode comprises an InGaN p-n junction having a peak emission wavelength of 475 to 480 nm.

38. The method of claim 35, wherein the step of forming the luminescent material comprises:
mixing a $Y_2O_3$ powder, a $CeO_2$ powder, an $Al_2O_3$ powder, a $GdO_2$ powder and an $AlF_3$ flux to form a first powder;

sintering the first powder in a reducing atmosphere to form a sintered body; and converting the sintered body into a second powder.

39. The method of claim 38, wherein:

the step of forming the light emitting diode comprises:
placing a light emitting diode into a shell; and
filling the shell with an encapsulating material;

and wherein the step of forming the luminescent material further comprises:

a) coating a suspension of the second powder and a solvent over a surface of the light emitting diode and drying the suspension;

b) interspersing the second powder in the encapsulating material; or c) coating a suspension of the second powder and a solvent onto the shell and drying the suspension.

40. The method of claim 29, wherein the radiation emitted by the system approximates the Black Body Locus on the CIE chromaticity diagram substantially independent of a thickness of the luminescent material for color temperatures ranging from 4000 K to 6000 K.

41. The method of claim 29, wherein the step of forming the light emitting diode comprises:

selecting an existing light emitting diode having an emission spectrum represented by the first point on the first line; and placing the light emitting diode into the illumination system.

42. The method of claim 29, wherein the step of forming the luminescent material comprises:

selecting an existing luminescent material having an emission spectrum represented by the second point on the first line; and placing the luminescent material into the illumination system.

43. The method of claim 29, further comprising forming at least one of plural light emitting diodes and plural luminescent materials based on a single step of selecting the first line which approximates the Black Body Locus.

44. The method of claim 28, wherein the radiation source comprises one of a laser diode or a radiative gas discharge in a plasma display or in a fluorescent lamp.

45. A method of making a white light illumination system containing a radiation source and a luminescent material, comprising:

selecting the radiation source whose emission spectrum represents a first point on a CIE chromaticity diagram;

selecting the luminescent material whose emission spectrum represents a second point on the CIE chromaticity diagram, such that a first line connecting the first point and the second point approximates a Black Body Locus on the CIE chromaticity diagram; and placing the radiation source and the luminescent material into the white light illumination system.

46. The method of claim 45, wherein:

the radiation source comprises a light emitting diode; and
the luminescent material comprises a phosphor.

47. The method of claim 46, wherein the first line intersects the Black Body Locus twice.

48. The method of claim 46, wherein the first line is tangential to the Black Body Locus.

49. The method of claim 46, wherein:

a third point and a fourth point on the first line are located less than 0.01 y-units away from the Black Body Locus on the CIE chromaticity diagram;

the third point corresponds to a first color temperature; and the fourth point corresponds to a second color temperature which is at least 2000 K greater than the first color temperature.

50. The method of claim 49, wherein:

the third point and the fourth point on the first line are located less than 0.005 y-units away from the Black Body Locus on the CIE chromaticity diagram.

51. The method of claim 50, wherein the first color temperature is 4000 K and the second color temperature is 6000K.

52. The method of claim 46, wherein:

a) the luminescent material comprises:
$(A_{1-x}Gd_x)_3D_5E_{12}$:Ce,
wherein A comprises at least one of Y, Lu, Sm and La;
D comprises at least one of Al, Ga, Sc and In;
E comprises oxygen; and
x>0.4; and b) a peak emission wavelength of the light emitting diode is greater than 470 nm.

53. The method of claim 52, wherein:

the luminescent material comprises $(Y_{1-x-z}Gd_xCe_z)_3Al_5O_{12}$; 0.7>x>0.4; and 0.1>z>0; and the light emitting diode peak emission wavelength is greater than 470 nm but less than 500 nm.

54. The method of claim 53, wherein the luminescent material comprises a $(Y_{0.37}Gd_{0.6}Ce_{0.03})_3Al_5O_{12}$ phosphor and the light emitting diode comprises an InGaN p-n junction having a peak emission wavelength of 475 to 480 nm.

55. The method of claim 46, wherein:

the step of placing the radiation source and the luminescent material into the white light illumination system comprises:

placing the light emitting diode into a shell; and a) coating a phosphor suspension over a surface of the light emitting diode and drying the suspension;

b) interspersing a phosphor powder and an encapsulating material in a shell; or c) coating a suspension of the phosphor powder and a solvent onto the shell and drying the suspension.

56. The method of claim 45, wherein the radiation emitted by the system approximates the Black Body Locus on the CIE chromaticity diagram substantially independent of a thickness of the luminescent material for color temperatures ranging from 4000 K to 6000 K.

57. The system of claim 1, wherein an emission spectrum of the system is represented by a point on the first line.

58. A white light illumination system comprising a radiation source and a luminescent material, wherein:

an emission spectrum of the radiation source represents a first point on a CIE chromaticity diagram;

the radiation source comprises a light emitting diode having a peak emission wavelength of 475 to 480 nm;

an emission spectrum of the luminescent material represents a second point on the CIE chromaticity diagram; and a first line connecting the first point and the second point approximates a Black Body Locus on the CIE chromaticity diagram.

59. The system of claim 58, wherein the luminescent material comprises $(Y_{1-x-z}Gd_xCe_z)_3Al_5O_{12}$; 0.7>x>0.4; and 0.1>z>0.

60. A white light illumination system comprising:

a) a luminescent material, comprising:

$(A_{1-x}Gd_x)_3D_5E_{12}$:Ce,
wherein A comprises at least one of Y, Lu, Sm and La;
D comprises at least one of Al, Ga, Sc and In;
E comprises oxygen; and
x>0.4;

b) a light emitting diode having a peak emission wavelength of 475 to 480 nm.

61. The system of claim 60, wherein:
the light emitting diode comprises an InGaN p-n junction; and
the luminescent material comprises $(Y_{1-x-z}Gd_xCe_z)_3Al_5O_{12}$; 0.7>x>0.4; and 0.1>z>0.

* * * * *